United States Patent [19]
Davis et al.

[11] Patent Number: 5,373,265
[45] Date of Patent: Dec. 13, 1994

[54] MODULATOR HAVING OSCILLATOR FOR GENERATING IF AND RF SIGNALS BY DIVISION AND UP-CONVERSION

[75] Inventors: Paul C. Davis, Muhlenburg Township, Berks County; Irving G. Post, Lower Alsac Township, Berks County, both of Pa.

[73] Assignee: AT&T Corp., Murray Hill, N.J.

[21] Appl. No.: 87,233

[22] Filed: Jul. 6, 1993

[51] Int. Cl.$^5$ ............................ H03C 1/52; H03C 1/60
[52] U.S. Cl. ..................................... 332/151; 332/167; 332/170; 455/46; 455/47; 455/102; 455/109
[58] Field of Search ............... 332/167, 168, 169, 170, 332/171, 151, 152; 455/46, 47, 102, 108, 109

[56] References Cited
U.S. PATENT DOCUMENTS

| | | | |
|---|---|---|---|
| 4,025,855 | 5/1977 | Atkinson | 455/109 |
| 4,540,958 | 9/1985 | Neyens et al. | 455/102 X |
| 5,243,304 | 9/1993 | Rixon | 455/102 X |

*Primary Examiner*—Siegfried H. Grimm

[57] ABSTRACT

Apparatus and method for effecting single sideband suppressed carrier modulation suitable for small, hand-held, high-frequency cellular radio transmitters such as those used at 900 mHz. A local oscillator generates a signal at 0.8 the frequency of the desired carrier. The generated frequency is counted down to produce an IF that is 0.2 the frequency of the desired carrier and the IF is mixed with the baseband signal to produce a modulated IF. The modulated IF is then mixed with the first generated signal to generate the modulated carrier signal. Advantageously, all of the foregoing components can be provided on the same integrated circuit chip.

9 Claims, 2 Drawing Sheets

IF 2 x IF 4 x IF

MODULATOR HAVING OSCILLATOR FOR GENERATING IF AND RF SIGNALS BY DIVISION AND UP-CONVERSION

FIELD OF THE INVENTION

This invention relates to modulation techniques and, more particularly, to single sideband suppressed carrier modulation suitable for small, hand-held, high-frequency cellular radio transmitters.

BACKGROUND OF THE PRIOR ART

A radio frequency carrier may be generated by using a local oscillator operating at the carrier frequency or by using two local oscillators and a mixer to generate the desired carrier frequency as the sum of the two local oscillator frequencies. The first scheme is sometimes referred to as "direct" up-conversion while the latter scheme is sometimes referred to as "double" up-conversion. In double up-conversion one of the local oscillators generates an intermediate frequency (IF) and the other local oscillator generates a frequency which is that of the radio frequency (RF) carrier minus the IF frequency. The mixer generates both sum and difference frequencies. The unwanted frequency, usually the difference frequency, is filtered out.

In either of the conversion arrangements, single sideband suppressed carrier operation requires that the baseband signal be derived from balanced amplifers and applied to two mixers in phase quadrature so that the carrier may be suppressed. After modulation, the desired RF sideband signal is power amplified and transmitted from an antenna. Unwanted sidebands are attenuated by suitable filters. Because the RF power is large compared to the power of the local oscillator, a small fraction of the signal from the antenna fed back to the local oscillator may have sufficient strength to cause the local oscillator to malfunction. In hand-held radios at 900 mHz, for example, sufficient shielding is almost impossible to achieve. Moreover, single sideband suppressed carrier systems dictate that the carrier frequency power level be at least 30 Db down from the power level of the desired sideband. Any leakage of the local oscillator to the output of the modulator package must therefore be controlled. Such leakage may be troublesome if, when the output power is desired to be attenuated, the leakage power remains constant.

In addition, a quadrature coding scheme requires that 90 degree phase-shifted signals be accurately generated. R-C networks for achieving an accurate 90 degree phase shift are difficult to achieve with the usual production run accuracy available in integrated circuits. Accordingly, such R-C networks must be fabricated as off-chip devices so that component tolerances can more accurately be controlled. It would be desirable to provide a modulation arrangement requiring only one local oscillator with all components being capable of being implemented on a single chip.

SUMMARY OF THE INVENTION

The foregoing and other objects and features of my invention are achieved in one illustrative embodiment in which the local oscillator generates a signal at 0.8 the frequency of the desired carrier. The generated frequency is counted down to produce an IF that is 0.2 the frequency of the desired carrier and the IF is mixed with the baseband signal to produce a modulated IF. The modulated IF is then mixed with the first generated signal to generate the modulated carrier signal. Unwanted difference frequencies are sufficiently remote from the frequency of the carrier that they can be removed by on-chip filters fabricated with the usual production-run accuracy components.

DETAILED DESCRIPTION

Figure 1:
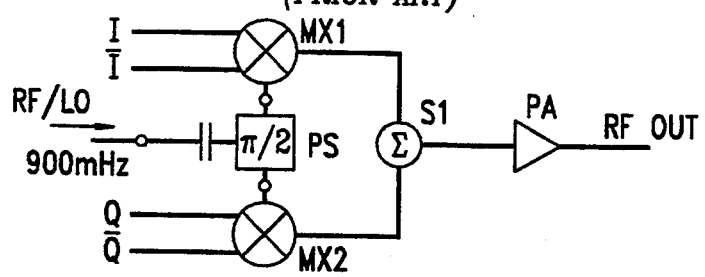
FIG. 1 depicts a prior art direct up-conversion modulation arrangement.

Referring to FIG. 1 there is shown in abbreviated schematic form a "direct" up-conversion modulator of the type disclosed in 1993 IEEE International Solid State Circuits Conference Proceedings Paper TP 9.2 entitled "A 900 mHz Transceiver Chip Set for Dual-Mode Cellular Radio Mobile Terminals" and co-authored by applicant. The modulator of FIG. 1 is called a "direct" up-conversion modulator because the RF carrier is directly mixed with the baseband signal in mixers MX1 and MX2. The carrier RF signal is obtained from a frequency synthesizer, local oscillator (not shown). The baseband signal will typically comprise three to eight digitally encoded 3 kHz time division multiplexed voice channels. For example, in the North American IS54 system three such voice channels are multiplexed into a baseband channel and adjacent baseband channels are separated by 30 KHz. In the European digital cellular system known as GSM eight voice channels are multiplexed into a baseband channel and adjacent baseband channels are separated by 200 kHz. For single sideband suppressed carrier operation, the baseband signal is obtained from the output of a pair of balanced differential amplifiers (not shown) and applied to mixers MX1 and MX2 at their respective input terminals I, Ibar, Q, Qbar. Mixers MX1, MX2 are driven by the RF carrier in quadrature phase in order to generate suppressed carrier sidebands. The RF carrier generated by the frequency synthesizer, local oscillator (not shown) is applied to phase splitter PS and the quadrature outputs of phase splitter PS drive mixers MX1 and MX2 respectively. The differential signals, I and Ibar and Q and Qbar are in quadrature phase.

Typically, phase splitter PS is comprised of an R-C network (not shown). The outputs of mixers MX1 and MX2 are applied to summer S1 and the output of summer S1 is fed to power amplifier PA and then to an antenna (not shown). Components MX1, MX2, S1 and PA are typically implemented on a single integrated circuit "chip". However, because the quadrature phase shift must be accurate to within one degree, phase splitter PS is typically fabricated "off-chip" since the tolerance of production-run integrated circuit R-C components is not sufficiently close to afford the required degree of phase splitting accuracy, typically plus or minus one degree at 900 mHz. In the drawing, such off-chip devices are indicated by small hollow circles in the circuit lead lines.

Because the signal at the output of power amplifier PA is very close to the frequency of the local oscillator there is a tendency for an appreciable fraction of the output signal to feed back to the frequency synthesizer, local oscillator disrupting its operation and possibly causing it to lose lock with its reference. Moreover, any feedback of the modulated RF signal to the input of mixers MX1 and MX2 will result in a re-modulation which produces a distorted signal and additional and unwanted sidebands. Shielding to prevent such feedback requires greater than 90 Db suppression at the 900 mHz frequency involved and is very difficult to obtain.

Figure 2:
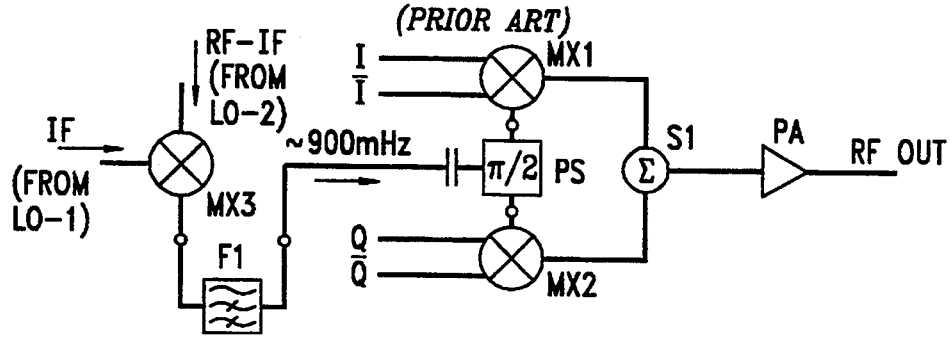
FIG. 2 depicts an alternative direct up-conversion modulation.

In FIG. 2 an alternative approach is shown which attempts to avoid the RF feedback problem. Two off-chip frequency synthesizer, local oscillators (outputs from which are labeled as "From LO-1" and "From LO-2") are required. One oscillator generates an intermediate frequency (IF) such as 100 or 200 mHz and the other oscillator generates a frequency equal to the desired carrier frequency (900 mHz) minus the IF frequency, e.g., 800 or 700 mHz. The RF minus IF frequency is applied to the upper terminal of a mixer MX3 and the IF frequency is applied to the left-hand terminal of mixer MX3. The output of mixer MX3 contains not only the sum of the IF and the RF minus the IF frequency (i.e., the desired RF carrier frequency of 900 mHz), but also the difference frequency as well which must be filtered out by filter F1. For an IF of 100 mHz the difference frequency is 700 mHz; while for an IF of 200 mHz the difference frequency is 500 mHz. Note that in both FIGS. 1 and 2 the mixers designated MX1 and MX2 receive as an input the phase-split RF carrier.

It is not economically feasible to fabricate filter F1 on the same integrated circuit chip as mixers MX1, MX2, MX3 and power amplifier PA. It is too difficult to fabricate an integrated circuit filter with sufficient Q and sharp enough roll-off at these frequencies to distinguish between the carrier and the unwanted difference frequency. Partly this is because the 20-30% variation in the value of the production run of capacitors and resistors on the chip is about the same as the ratio of the unwanted frequency to the carrier frequency. Accordingly, the filter cutoff frequency will vary through the range desired to be eliminated. Filter F1 must therefore be fabricated as an "off-chip" device and connected to the chip by solder terminals, t. The embodiment of FIG. 2 solves the problem of synthesizer, local oscillator malfunction because the frequency of the carrier is different from that of the synthesizer, local oscillator. However, because filter F1 is an off-chip device, its solder terminals and lead-in wires are long enough to act as antennae at 900 mHz and there is still a substantial likelihood that the output will be remodulated. The remodulation introduces unwanted sidebands that are a combination of twice the baseband signal and the frequency of the carrier and therefore will lie in the adjacent channel. In other words the difficulty with the embodiment of FIG. 2 is that unwanted sidebands are generated at integer multiples of the baseband frequency.

Figure 3:
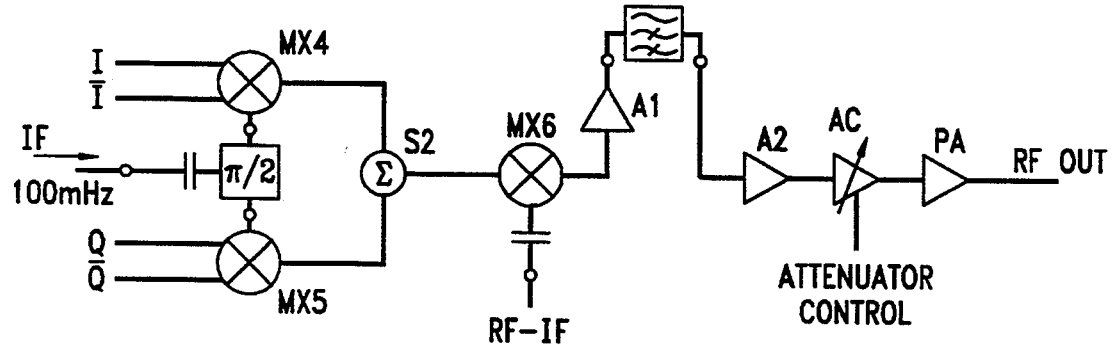
FIG. 3 depicts a double up-conversion modulation arrangement employing two local oscillators.

In FIG. 3 a "double" up-conversion modulation scheme is depicted. The baseband signals are introduced to mixers MX3 and MX4 which now are provided with an IF signal (at approximately 100 mHz), instead of the 900 mHz RF carrier signal of mixers MX1 and MX2 of the FIGS. 1 and embodiments. The 100 mHz modulated output of mixers MX3 and MX4 are applied to summer S2 whose output, in turn, is applied to the left-hand input of mixer MX6. The other input of mixer MX6 is driven by a synthesizer, local oscillator at a frequency equal to that of the 900 mHz carrier minus the IF, or approximately 800 mHz. Accordingly, the output of mixer MX6 will be 900 mHz, modulated by the baseband signal, plus the difference between the IF and the 800 mHz other frequency or 700 mHz. The 700 mHz signal must be filtered out by an off-chip filter F1 as in FIG. 2. The solder terminals and lead lengths of the off-chip filter may also serve as antennae, however the sidebands produced by re-modulation in MX6 will be 800 mHz plus 900 mHz or 1700 mHz and 100 mHz, sidebands which will not interfere with adjacent channels. However, filter F1 is usually required to have a 50 ohm impedance thereby demanding a considerable amount of "dc" power to maintain sufficient voltage levels to drive the power amplifier. In addition, a buffer-amplifier BA will be required to compensate for the power loss in the filter.

Figure 4:
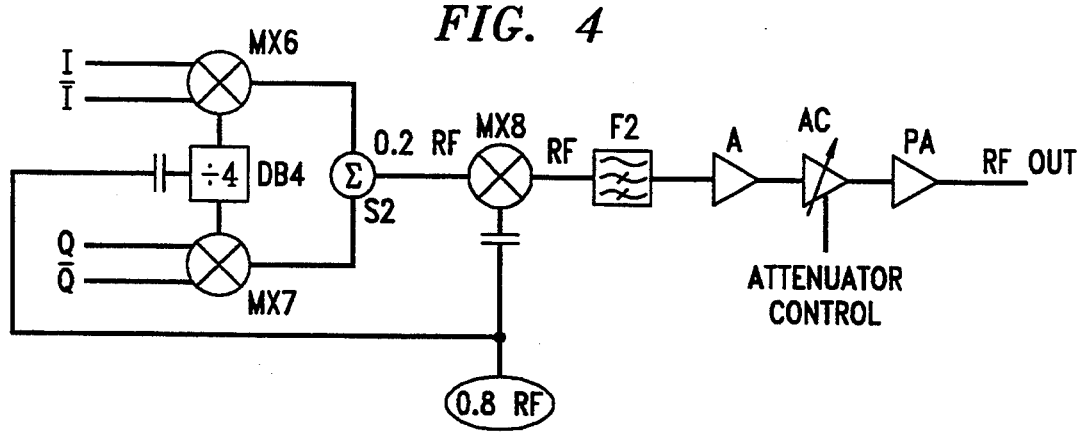
FIG. 4 shows the illustrative embodiment of my invention employing only one local oscillator.
Figure 5A:
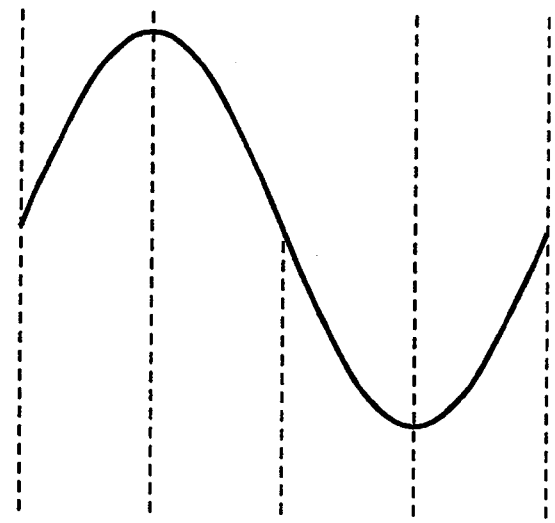
FIG. 5a, 5b and 5c show the phase relationships at the input and output of the divide by four circuit.
Figure 5B:
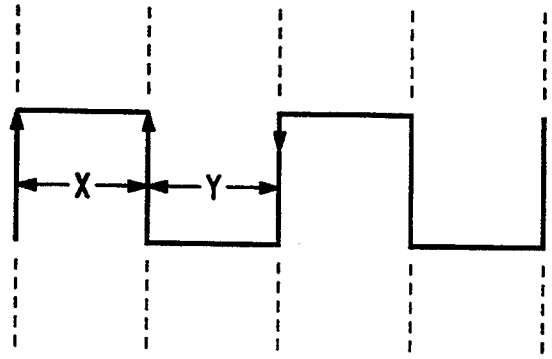
Figure 5C:
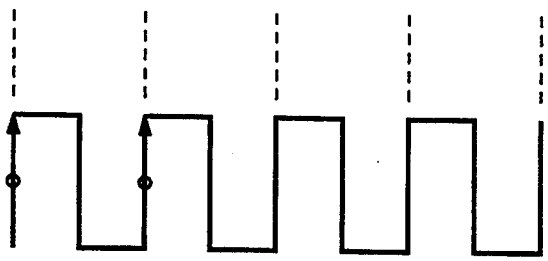

Referring now to FIG. 4 there is shown the embodiment of my invention which solves both feedback problems without requiring an off-chip filter. Instead of employing an R-C circuit such as PS to generate the quadrature signals for driving the mixers the embodiment of FIG. 4 derives the quadrature signals by first generating a frequency that is four times the IF frequency and then dividing this signal by four in a down-counter circuit DB4 to identify the quadrature points of the IF frequency wave. Referring to FIG. 5a-5c the phase relationship of the IF signal and a signal four times the IF frequency is shown. It will be appreciated that successive leading edges of the higer frequency signal define points that are 90 degrees apart at the IF frequency.

Circuit DB4 may, advantageously, be fabricated on the same chip as the other components in FIG. 4. For example, a frequency synthesizer which generates a signal that is four times the IF frequency may be located on this chip. Successive leading edges of this signal when down-counted by four by circuit DB4 define points that are 90 degrees apart in phase at the IF frequency. A particularly advantageous way of generating the frequency that is four times the IF frequency is to employ a frequency synthesizer that operates at a frequency that is 0.8 of the frequency of the 900 mHz RF carrier, or 720 mHz. Circuit DB4 then down-counts this frequency to an IF frequency of 180 mHz.

The quadrature points of the IF frequency could, of course, be located merely by down-counting the 720 mHz signal by two but then successive half cycles "x" and "y" of the 360 mHz signal would have to be perfectly equal in length, i.e., a perfect duty cycle would be required. When a divide by four circuit is used the rising edges of the 720 mHz signal define the boundaries of a single cycle so that symmetry of successive half-cycles is not required.

The output of divide by four circuit DB4 is two quadrature IF signals that are 0.2 of the RF carrier frequency. The quadrature IF signals are applied to mixers MX6 and MX7 which modulate the base band signal. The outputs of mixers MX6 and MX7 are applied to summer S2. The output of summer S2 is applied to one input of mixer MX8 and the 0.8 RF signal is applied to the other input. Accordingly, mixer MX8 produces at its output a sum and difference signal, the sum signal being the desired RF carrier frequency (900 mHz) and the difference signal being 0.6 the RF carrier frequency (540 mHz). The 540 mHz signal being sufficiently far away from the carrier may be filtered out by an on-chip filter F2 since the usual production run variation in the value of its resistors that cause a variation in its cutoff frequency will still be effective to attenuate the unwanted sideband.

It will be apparent that instead of dividing the 720 mHz signal by four, it would also have been possible to generate a 400 mHz signal and divide it by four to arrive at an IF frequency of 100 mHz. It should also be apparent that the embodiment of FIG. 3 instead of employing an R-C circuit to generate the quadrature IF signals for driving mixers MX4 and MX5 could have employed a frequency synthesizer, local oscillator to generate a higher-than IF frequency (such as 400 mHz) and a divide-by-four circuit to define the 100 mHz quadrature IF signals. However the circuit of FIG. 3 still requires two frequency synthesizer, local oscillators, one generating 400 mHz and the other generating the RF minus IF frequency of 800 mHz. Moreover, the one part per million accuracy required of the RF carrier frequency requires that the synthesizer, local oscillator generating the RF minus IF carrier also be generated with the same one part per million accuracy. In contrast, the embodiment of FIG. 4 requires only one high accuracy synthesizer local oscillator.

While the principles of my invention have been described with particularity it should be apparent to those skilled in the art that numerous modifications may be made without however departing from the spirit and scope of my invention.

What is claimed is:

1. A method of modulating a carrier with a baseband signal, comprising the steps of:
   a. synthesizing a first frequency which is 80 percent of the frequency of said carrier,
   b. dividing said first frequency to provide an intermediate frequency that is 20 percent of said carrier frequency;
   c. modulating said intermediate frequency with said baseband signal to produce a modulated intermediate frequency signal, and
   d. mixing said modulated intermediate frequency signal with said synthesized first frequency to produce a modulated carrier signal.

2. The method of modulating according to claim 1 wherein said signal for modulating said intermediate frequency is in quadrature phase with said intermediate frequency.

3. The method of modulating according to claim 1 wherein said carrier frequency is suppressed.

4. The method of modulating according to claim 1 wherein said modulated intermediate frequency signal comprises a pair of sideband signals.

5. The method of modulating according to claim 4 wherein one of said sideband signals is suppressed.

6. A method of modulating according to claim 1 wherein said carrier frequency is approximately 900 mHz.

7. Circuitry for modulating a carrier with a baseband frequency, comprising,
   a. means for generating a first frequency which is 80 percent of the desired carrier frequency;
   b. means for producing an intermediate frequency from said frequency generated by said generating means that is one-fifth the frequency of said carrier;
   c. means for modulating said intermediate frequency with said baseband signal to produce a modulated intermediate frequency signal; and
   d. means for mixing said modulated intermediate frequency signal with said first frequency to produce a modulated carrier signal.

8. A method of modulating a carrier with a baseband signal, comprising the steps of:
   a. synthesizing a first frequency which is M percent of the frequency of said carrier,
   b. dividing said first frequency to provide an intermediate frequency that is 100—M percent of said carrier frequency;
   c. modulating said intermediate frequency with said baseband signal to produce a modulated intermediate frequency signal, and
   d. mixing said modulated intermediate frequency signal with said synthesized first frequency to produce a modulated carrier signal.

9. A method of modulating a carrier with a baseband signal according to claim 8 wherein M is 80.

* * * * *